United States Patent [19]

Kinzelman et al.

[11] Patent Number: 5,594,741
[45] Date of Patent: Jan. 14, 1997

[54] METHOD FOR CONTROL OF RANDOM TEST VECTOR GENERATION

[75] Inventors: Paul M. Kinzelman, Hudson; Nicholas A. Warchol, Boxborough, both of Mass.

[73] Assignee: Digital Equipment Corporation, Maynard, Mass.

[21] Appl. No.: 345,271

[22] Filed: Nov. 28, 1994

Related U.S. Application Data

[63] Continuation of Ser. No. 40,796, Mar. 31, 1993, abandoned.

[51] Int. Cl.$^6$ .................................................. G06F 11/00
[52] U.S. Cl. .................... 371/27; 371/51.1; 371/25.1; 364/578; 395/920; 395/183.01
[58] Field of Search ............... 371/27, 16.1, 51.1, 371/25.1; 395/275, 575, 183.1; 364/578, 488, 489, 490

[56] References Cited

U.S. PATENT DOCUMENTS

| | | | |
|---|---|---|---|
| 4,183,459 | 1/1980 | Don et al. | 371/16.1 |
| 4,194,113 | 3/1980 | Fulks et al. | 371/22.4 |
| 4,282,584 | 8/1981 | Brown et al. | 395/275 |
| 4,306,286 | 12/1981 | Cocke et al. | 364/200 |
| 4,527,798 | 7/1985 | Siekierski et al. | 364/717 |
| 4,635,259 | 6/1987 | Schinabeck et al. | 371/25 |
| 4,687,988 | 8/1987 | Eichelberger et al. | 324/73.1 |
| 4,823,119 | 4/1989 | Ishii | 340/703 |
| 4,873,656 | 10/1989 | Catlin | 364/578 |
| 5,010,331 | 4/1991 | Dias et al. | 340/825.31 |
| 5,202,889 | 4/1993 | Aharon et al. | 371/22.3 |
| 5,214,655 | 5/1993 | Eichelberger et al. | 371/22.3 |
| 5,233,612 | 8/1993 | Huyskens et al. | 371/22.3 |

OTHER PUBLICATIONS

Ulrich E., "Serial/parallel event scheduling for the simulation of large systems";Preceeding–1968 ACM National Coference 1968.

Menzel et al.; "A multi–level simulation system for MOS VLSI networks"; IEEE 1989 Feb. 1989.

*Primary Examiner*—Ellis B. Ramirez
*Assistant Examiner*—Kamini S. Shah
*Attorney, Agent, or Firm*—Lindsay G. McGuinness; Denis G. Maloney; Arthur W. Fisher

[57] ABSTRACT

A method of testing an integrated circuit design includes the steps of providing a logical model of an integrated circuit, having a plurality of data ports, providing at least two simulators, the first simulator coupled to a first data port of the integrated circuit model, and the second simulator coupled to a second different data ports of said integrated circuit model. The further includes the steps of providing an instruction stream to the first and second simulators, the instruction stream including at least two instruction threads corresponding to the at least two simulators, the simulators providing signals to the data ports in accordance with instructions provided from each of the instruction threads. In addition, the method further includes the step of delaying the first simulator from processing its corresponding instruction thread until dependencies between instruction threads have been satisfied.

8 Claims, 6 Drawing Sheets

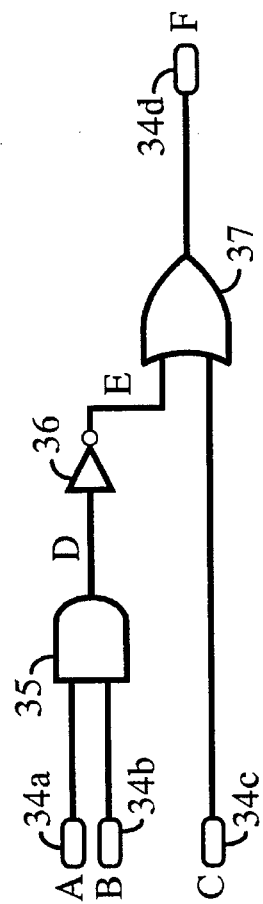
FIG. 2B
40 — D = A AND B
41 — E = NOT(D)
42 — F = E OR C
FIG. 2C
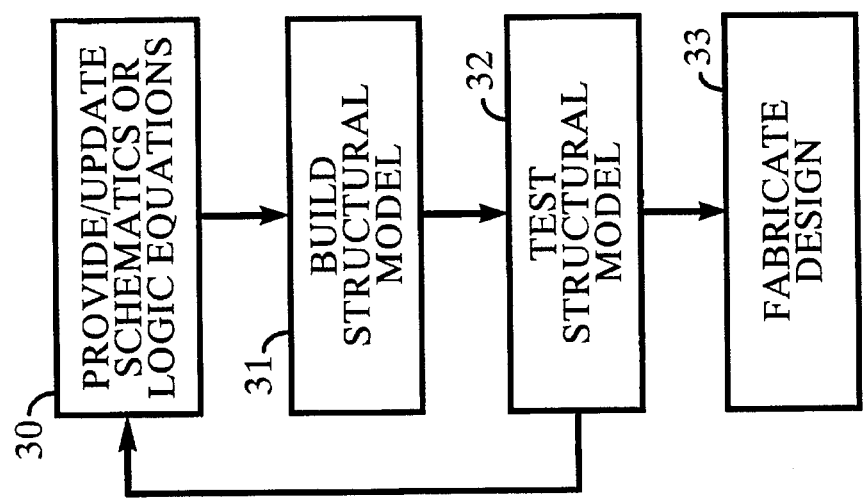
FIG. 2A

METHOD FOR CONTROL OF RANDOM TEST VECTOR GENERATION

This application is a continuation of application Ser. No. 08/040,796, filed Mar. 31, 1993 now abandoned.

FIELD OF THE INVENTION

This invention relates generally to integrated circuits and more specifically to testing integrated circuits.

BACKGROUND OF THE INVENTION

As it is known in the art, integrated circuits may be designed to perform many complex logical functions and to serve as an interface between one or more external functional units, such as memory or another integrated circuit. As technology advances, the amount of functional logic able to be contained in one integrated circuit is constantly increasing.

As the density of functional logic within one integrated circuit increases, it becomes more important to eliminate any logical flaws since such flaws within a circuit may not be easily fixed without the expense and time delay associated with redesign and refabrication of the integrated circuit. Due to the rapidly advancing technology, additional time delays in manufacturing an integrated circuit are highly undesirable, because if many rebuilds of the integrated circuit are necessary before it can be assured that the integrated circuit is operating as expected, the integrated circuit may become obsolete. Therefore it is desirable to identify as many logical design problems within the integrated circuit before it is actually manufactured.

One method of accomplishing this task is by building a model in software of the integrated circuit. A test set is then developed to test various functional units of the model of the integrated circuit to ensure that the model and hence the integrated circuit operate as expected before it is manufactured. The test set is a data set representing data which is provided to the pins of the integrated circuit at different time intervals to simulate transactions on the external pins of the device which in turn exercise internal functions of the integrated circuit.

One method of developing a test set involves a designer identifying common transactions which the integrated circuit may perform. A transaction based simulator or a transactor is then used to simulate identified transactions by providing digital values representing signal values on the input pins of the structural model in a particular order. When the digital values are provided in the correct order, a given transaction may be simulated. For example, to transfer data into a model of an integrated circuit, the data is first provided to the input pins, and then clocks for the integrated circuit model are cycled to clock the data into the integrated circuit model.

For data busses with a more complex protocol, there may be additional steps necessary for transferring data. For example, a given bus protocol may require that for a write instruction, the initial data on the bus is the address, and data in the following cycle is data which is to be written to that address. The transactor responds to a write instruction by simulating the operation according to the bus protocol by depositing digital data values to the input pins of the integrated circuit model and clocking the digital data values into the integrated circuit model in the correct order. Instructions which cause signal values to be provided at the pins of the integrated circuit are commonly called 'commander' and 'responder' instructions.

The transactor uses the commander and responder instructions as follows. A structural model may have multiple ports, for example, a port which interfaces with a CPU and a port which interfaces with a memory. Here, for clarification, the bus which communicates with the CPU is termed Bus_A and the bus which communicates with memory is termed Bus_B. The commander instruction initiates a read by providing digital data values on the pins of Bus_A of the model in the correct order to simulate a read request. The read command propagates to Bus_B of the model. In response to signals provided on Bus_B by the model, the responder instruction deposits digital data values on the pins of Bus_B of the model. The digital data values provided on Bus_B by the responder instruction correspond to the read data which would be supplied by a memory device in response to the read command. The read data is returned to Bus_A of the model, and the read commander instruction verifies the results on the pins of Bus_A against the expected results.

One problem associated with using a transactor to test an integrated circuit is that the tests that the transactor performs are generally manually generated, that is the person generating the test for the integrated circuit decides what functions need to be tested, and provides instructions which test the functions in the test set. When the integrated circuit is placed in the destination circuit board, however, design errors may be uncovered due to unforeseen interactions of different functions on the circuit board. These unforeseen interactions may be a result of many different functions happening simultaneously within the chip, rather than serially, as simulated by the manually generated test set.

One way to find all the design flaws within an integrated circuit is to build a structural model of the entire computer system, and attempt to find errors by executing actual system software. A drawback of this approach is that a structural model of the entire system has an enormous amount of gates, and consequently an enormous amount of memory is needed to store the structural model. Therefore, simulation runs using the structural model process instructions very slowly. Because it is desirable to have a fast turn-around time between error detection, error repair, and re-execution of tests, it is not feasible to use an entire system simulation to test the functionality of one gate array.

SUMMARY OF THE INVENTION

In accordance with the present invention, a method of testing an integrated circuit design includes the steps of providing a logical model of an integrated circuit, having a plurality of data ports, providing at least two transactors, the first transactor coupled to a first data port of the integrated circuit model, and the second transactor coupled to a second different data ports of said integrated circuit model. The method further includes the steps of providing an instruction stream to the first and second transactors, the instruction stream including at least two instruction threads corresponding to the at least two transactors, the transactors providing signals to the data ports in accordance with instructions provided from each of the instruction threads. In addition, the method further includes the step of delaying the first transactor from processing its corresponding instruction thread until dependencies between instruction threads have been satisfied. With such an arrangement, a technique is provided to test the integrated circuit. By allowing the transactors to operate independently and simultaneously on the model, interactions between blocks in the design are tested to uncover design errors. By precluding one transactor from operating on its instruction thread only when dependencies between instruction threads occur, the amount of time during which each transactor may operate independently and simultaneously is maximized because instances in which each thread must be in synchronization with the other threads is selectively minimized.

Accordingly, this technique can be used to simulate a system environment by allowing selective synchronization of the interfaces between transactors while maximizing the amount of interactions within the model, and thus detection of errors in the design is facilitated.

BRIEF DESCRIPTION OF THE DRAWINGS

FIGS. 2A–2C illustrates a method of verifying the design of the computer system of FIG. 1;

DESCRIPTION OF THE PREFERRED EMBODIMENT

Figure 1:
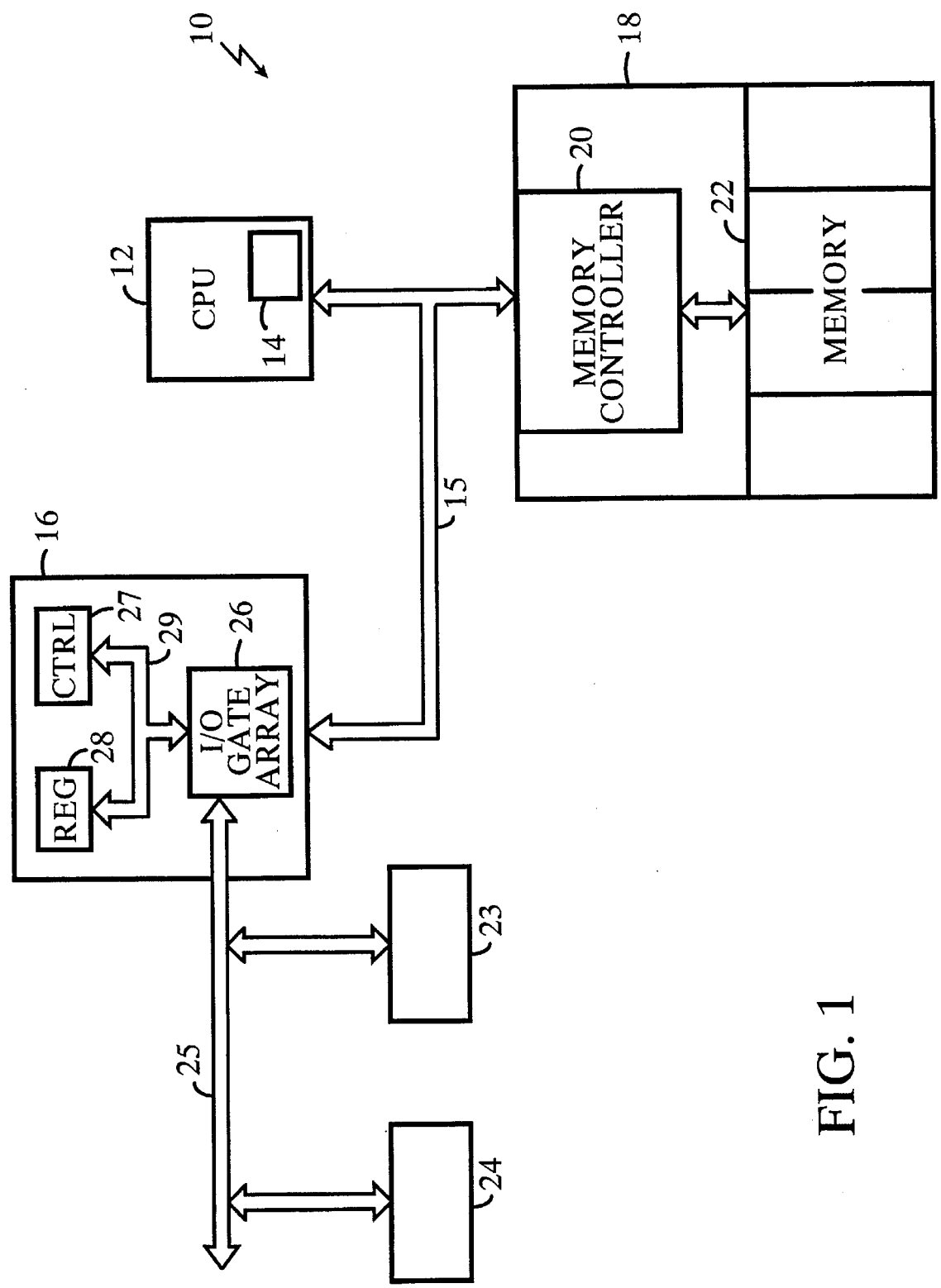
FIG. 1 illustrates a computer system for design verification by the present invention.

Referring now to FIG. 1, a typical computer system 10 includes a Central Processing Unit (CPU) 12 which is used to process an instruction set. A system bus 15 couples the CPU 12 to a I/O unit 16 and a main memory unit 18 which includes a memory controller 20 for controlling accesses by the I/O unit 16 and the CPU 12 to memory devices 22. The I/O unit 16 enables the CPU 12 to communicate with a variety of external devices 23 and 24 via I/O bus 25. The external devices 23 and 24 may include for example disk drives and printers.

Each of the functional units 12, 18, and 16, of the computer system 10 perform a variety of tasks. For example, the CPU unit 12 typically includes an integrated circuit 14 having logic for decoding the instruction set and an arithmetic logic circuit to perform addition, subtraction, and logical functions such as logical AND, OR's etc., a register set to store values which are used by the instruction set, a small, fast memory, commonly known as a cache, to reduce the latency associated with accessing the memory unit 18, and diagnostic hardware.

The I/O unit may include, for example, a gate array 26 including logic designed according to the protocol of the I/O bus 25 both to control the flow of data on the I/O bus 25 and to interface data on the I/O bus 25 to system bus 15, specialized control hardware 27 to communicate with external devices such as the console or a network interface, and various other interrupt and status hardware 28. A local bus 29 couples the I/O gate array 26 to the control hardware 27 and the status hardware 28 to perform local operations of the I/O unit 16, such as handling interrupts and providing device arbitration.

The memory controller logic 20 of the memory unit 18 is used to facilitate access by the I/O unit 16 and the CPU 12 to the memory devices 22, in addition to providing the correct control signals for reading and writing memory, and performing memory refresh.

Each of the functions that the units 12,18, and 16 perform are dictated by the architecture of the CPU 12, the protocol of the I/O bus 25, the protocol of the system bus 15, and the speed of the components. As technology advances, and new functional units are designed, they must be tested to ensure they function as expected.

Due to the high cost of fabricating components, it is desirable to ensure that all of the potential problems have been removed from the functional units before they are fabricated.

Referring now to FIGS. 2A–2C, a method that is used to remove errors from functional logic is shown.

At step 30 in FIG. 2A, a logic design is provided by the design engineer, either in the form of logic equations or schematic diagrams. An example of a schematic diagram is shown in FIG. 2B. The schematic diagram is basically a circuit design using logic gates which are available in the integrated circuit technology. A library of available logic gates is maintained, including both the physical and logical characteristics of each gate. The physical characteristics indicate the time delay of each path through the logic gate. The logical characteristics indicate the logical function performed by the gate. For example, the library entries for a typical AND gate (such as AND gate 35 in FIG. 2B) are shown in Table I below.

TABLE I

| INPUT PINS | A | B |
|---|---|---|
| OUTPUT PINS | D | |
| DELAYS | A -> D | 2.0 NS |
| | B -> D | 2.3 NS |
| LOGICAL FUNCTION | D = A AND B | |

Referring now to FIG. 2B a circuit having 3 input pins 34a, 34b, and 34c, which are associated with the three input signals A, B, and C is shown, also FIG. 2C shows logical equations corresponding to outputs D, E and F from each of the gates shown in FIG. 2B. The input signal values of A and B are provided to AND gate 35, to provide the signal value D at step 40 (FIG. 2C). The signal value D is inverted by inverter 36 to provide the signal value E at step 41 (FIG. 2C). The signal value E is then logically "ored" by OR gate 37 with the signal value of C, to provide the output signal value F at step 42 to output pin 34d. The input pins 34a, 34b, 34c and the output pin 34d are specifically identified in the schematic as external pins. Thus, an example of a structural model provided by step 31 of FIG. 2A of the circuit of FIG. 2B, is shown, in FIG. 2C. The structural model is thus a program which identifies the logical connections of all of the gates within the model and functions as indicated by the schematics. The structural model thus allows the integrated circuit functionality to be simulated by depositing input values on the input pins, and examining the output values asserted on the output pins at specific points in time.

In order to test the schematic of 2B, at step 32, various signal values are deposited on the input pins 34a, 34b, and 34c, resulting in an output signal value assertion on pin 34d. The output pin 34d is checked for the expected value. If the expected value is inconsistent with the simulated value, the designer identifies the error, corrects the design, re-builds the structural model, and re-runs the test. This correction process continues until all the errors are removed from the design.

Although this example has been shown with a relatively simple circuit, in reality the logical functions which are simulated may include tens of thousands of logical gates, and steps 30, 31, and 32 are repeated many times until the designer is ensured that all of the errors have been removed. Once all logical errors have been removed from the design, at step 33 the design may then be submitted for circuit layout, and subsequently fabrication.

Because each functional unit may include tens of thousands of gates, and interface with many other functional units, it is desirable to develop a method of providing tests which will effectively verify the logical function of the unit and its interfaces. The method of the present invention uses transactors to simulate other components in the computer system 10 which are not under test.

Figure 3:
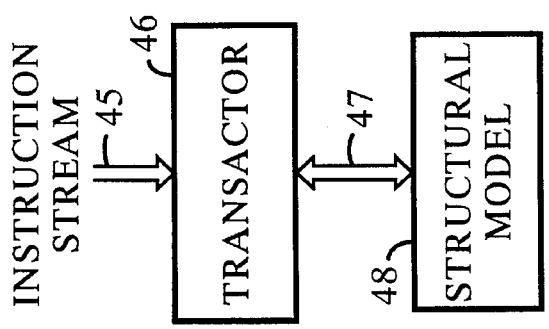
FIG. 3 illustrates the use of a transactor for use in replacing components of the computer system of FIG. 1.

Referring now to FIG. 3, a transactor 46 used to test a structural model 48 is shown. The transactor 46 executes on a computer system and includes a software model of a functional block or combination of functional blocks, that is a program which emulates the functionality of the blocks but does not contain the gate specific information which is found in a structural model as provided by step 31 of FIG. 2A.

Rather, the transactor is a program written in a high level language, such as C, that provides inputs to and receives outputs from the structural model provided by step 31. The transactor 46 includes information identifying the interface pins of the structural model 48, and responds in an event driven manner to both an input instruction stream 45 as well as to the data on the pins of the structural model 48.

For example, an instruction from instruction stream 45 would cause the transactor 46 to provide data to the input pins of the structural model 48 in an appropriate order to perform the instruction. Also, the transactor 46 may respond to sequences of data on the interface pins of structural model 48 to perform a different transaction.

The interface of the structural model with the transactor is achieved during the compilation portion of building the structural model (step 31 of FIG. 2A). If it is indicated by the user that a transactor should be included in the model (commonly by a predefined compiler "switch" such as —CBUS for using a CBUS transactor), the two programs are compiled together so that they 'share' the interface data pins, and are therefore able to transfer data between the two programs. Because a high level language program utilizes less memory than a gate specific structural model, the transactors help to reduce the memory size needed to create the overall system model, thereby increasing the simulation speed of the system model.

It should be noted that the transactor does not emulate the entire functionality of the functional block, only enough to initiate transactions and respond to transactions initiate by the unit under test. That is the transactor is designed to simulate the correct interface protocol of the structural model.

The functions which the transactor 46 performs on a structural model 48 are in accordance with a base input instruction stream 45. The transactor 46 decodes and processes each instruction, providing digital data values each cycle on the appropriate structural model input pins, and monitoring the data values received on the structural model output pins for each clock cycle simulated. An instruction processed by the transactor 46 may include data which is expected from the output pins in response to the instruction. In such a case, the transactor 46 compares the data received from the output pins with the expected data and determines when an error in the structural model has occurred.

The instruction stream 45 includes commander and responder instructions associated with each transactor. A commander instruction is a instruction which initiates an operation to the unit under test. The responder instruction responds to operations initiated by the device under test. Both the commander instruction and the responder instruction check data received on the output pins of the structural model against expected data for that operation to determine if there is a design error in the structural model.

For example, the use of a commander instruction and its associated responder instruction is achieved as follows. Referring again to FIG. 1, a first transactor could be used to replace external device 24. The first transactor initiates a read of memory 18 by issuing a commander instruction to the transactor replacing external device 24. The commander instruction includes the expected read data. The commander instruction causes the I/O gate array 26 to provide the control and address signal sequence to the memory device.

If the I/O gate array 26 is operating as expected, the read request propagates through the I/O gate array 26 from the external device interface pins to the main bus 15 interface pins of the structural model of I/O gate array 26.

A second transactor could be used to replace the memory device 18. The second transactor would initiate a responder instruction in response to the signal assertions at the main bus 15 interface of the structural model of I/O gate array 26. The responder instruction simulates the memory device 18 by providing the data located at the address provided by the structural model. The I/O gate array 26 then propagates this data to the correct external interface pins of the structural model, and the first transactor replacing external device 24 compares the data provided by the I/O gate array 26 against the expected data in the commander instruction to determine if the I/O gate array 26 is operating as expected. The transactors, therefore, serve the dual purpose of providing instructions to the input pins of the unit under test and detecting any errors which occur due to a flaw in the structural model.

It should be noted that often there is not a corresponding responder instruction for each commander instruction. For instance, a commander instruction which simply manipulated a state (i.e. accessed an internal register) within a unit under test would not have a corresponding responder instruction, because the action performed by the commander instruction did not cause any assertions on the output pins of the unit under test. Similarly, in certain instances a commander instruction is not necessary for each responder instruction. For example, if one commander instruction issues a read for an entire block of data, multiple responder instructions would be needed to read sequential longword addresses from memory. Therefore, although there may be a relationship between commander instructions and responder instructions, the relationship is not always predictable.

The described arrangement allows any number of individual components of the computer system 10 to be tested by providing transactors to supply the appropriate commands and responses to the unit(s) under test to simulate the entire computer system 10. Thus, because the entire system is simulated using a structural model of one component, and transactors emulating the remaining components, interactions between units in the computer system may be tested to uncover design errors which are otherwise unforeseeable.

Figure 4:
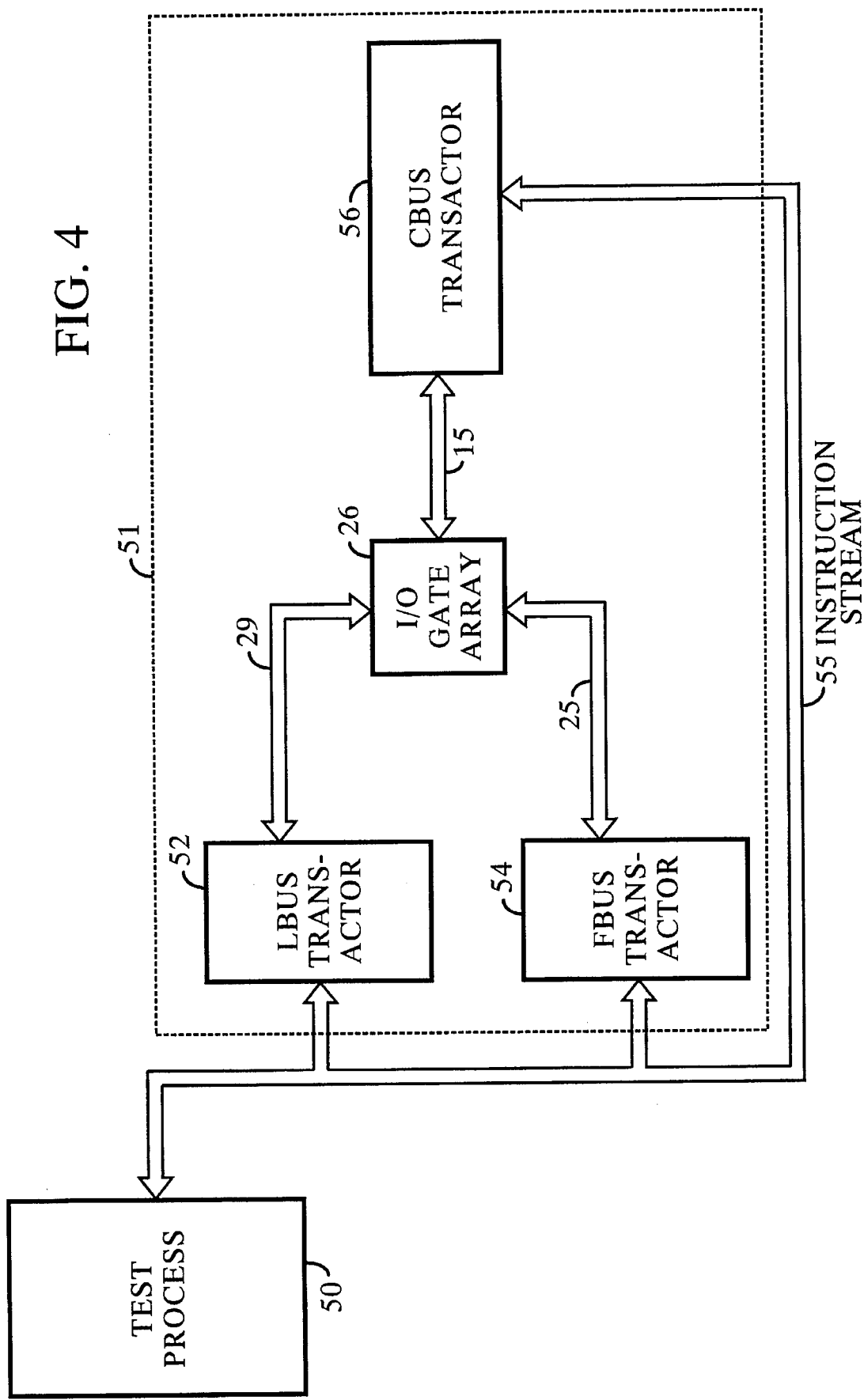
FIG. 4 illustrates the use of transactors by the present invention to simulate the computer system of FIG. 1 to verify a functional unit.

Referring now to FIG. 4, an example of the use of transactors to test a portion of the computer system 10 of FIG. 1 is shown. A system simulation model 51, representing functionality of computer system 10 (FIG. 1) is built using transactors 52, 54, and 56 which are linked with the I/O gate array model 26 via the bus interfaces, as described previously with regard to FIG. 3. The system simulation model 51 is shown in dashed lines in FIG. 4.

A test process 50 receives user information identifying which functional units of the computer system 10 are to be represented by transactors. The test process 50 uses this information to provide an instruction stream 55 which drives transactors to simulate portions of the computer system 10. Each transactor 52, 54 and 56, processes the same instruction stream 55. However, each transactor only executes instructions which are specifically designated to the given transactor. All instructions from instruction stream 55 which are designated to a given transactor are called the instruction thread for that transactor. The instruction stream 55 of FIG. 4 therefore includes an instruction thread for each of the transactors 52, 54 and 56. Thus, the test process 50 is used to provide input to the system simulation model 51 in order to exercise all of the logical function within the I/O gate array 26.

In the example of FIG. 4, the I/O gate array 26 from FIG. 1 is the unit under test. When testing the I/O gate array 26, a transaction which would be provided by the CPU unit 12 or the memory unit 18 on system bus 15 is provided by a CBUS (CPU/Memory Bus) transactor 56 which processes a sequence of instructions referred to as a CBUS instruction 'thread'. As mentioned previously, the CBUS thread includes CBUS commander instructions (CBC), and CBUS responder instructions (CBR). The CBUS commander instructions are commands issued by the CPU unit 12 (FIG. 1) to the I/O gate array 26, as well as CPU commands to the memory unit 18. The CBUS responder instructions provide data from the memory unit 18 in response to requests for data by either the CPU unit 12, I/O unit 16, or external devices 23 and 24. By using both CBUS instruction threads, the interface between the I/O gate array 26 and the CPU unit 12 and memory unit 18 can be verified to be operating as expected.

Transactions which occur on the I/O bus 25 (which in the preferred embodiment is a bus according to the FutureBus® protocol) are simulated by an FBUS transactor 54. The FBUS transactor 54 processes an FBUS instruction thread including commander instructions (FBC) which include commands that would be issued from one external I/O device 24 (FIG. 1) on the I/O bus 25 to a second external I/O device 23 (FIG. 1) on the I/O bus 25. In addition, the FBUS instruction thread includes commander transactions between either one of the external I/O devices and the CPU 12 (FIG. 1) or memory device 18 (FIG. 1).

The FBUS instruction thread also includes responder instructions (FBR) to provide data from the external I/O device 23 in response to the command issued from external I/O device 24, or in response to a request from the CPU 12. Thus, the logic within the I/O gate array 26 which controls the arbitration and protocol of the I/O bus 25 may be tested with the use of the FBUS instruction threads.

Commonly, the interfaces between the I/O unit 16 (FIG. 1) and external devices 23,24 (FIG. 1) are difficult to simulate due to the overlap of external device requests for use of the I/O bus 25 which occur in a physical operating environment. By using transactors to simulate external devices, the unpredictability of the environment may be more accurately depicted, and thus the discovery of design flaws is facilitated.

In addition to testing the system bus 15 interface, and the I/O bus 25 interface, the interface between the local bus 29 of I/O unit 16 (FIG. 1) is verified using an LBUS (Local Bus) transactor 52. The LBUS transactor processes an LBUS instruction thread including commands and responses which emulate logic (other than the I/O gate array 26) which is included on the I/O unit 16 (FIG. 1). For example, the LBUS commander instructions may provide commands from the control hardware 27, which may be, for example a disk or network controller, to the I/O gate array 26. The LBUS responder instructions are used to provide data from the various status registers 28 on the I/O unit 16 to the I/O gate array 26.

Thus, the effect of simulating the I/O gate array 26 in a fully operating computer system can be achieved by using the structural model of the I/O gate array in conjunction with an LBUS transactor 52, an FBUS transactor 54, and a CBUS transactor 56.

In the described transactor based simulation of FIG. 4, the CBUS transactor 56, the FBUS transactor 54, and the LBUS transactor 52 all process instruction stream 55. However, as mentioned previously, each only executes instructions designated for the given transactor, or their instruction 'thread'. When a transactor discovers an instruction in instruction stream 55 which is not designated to that transactor, it skips the instruction, and continues processing instruction stream 55 until it locates an executable instruction. Thus, each transactor may be executing different instructions of the instruction thread 55 simultaneously.

However, because the transactors operate on an identical instruction stream, a commander instruction from one instruction thread may require data from a responder instruction in a different instruction thread. For example, FBUS transactor 54, could issue a commander instruction to read data from memory. The memory is simulated by the CBUS transactor 56. The FBUS commander instruction is thus dependent upon data from a CBUS responder instruction. As such, the FBUS thread may therefore have to wait until a previous CBUS commander thread has received data from the CBUS responder thread in the CBUS instruction stream. Due to the thread interdependencies, the instruction threads could be synchronized in order to align responder instructions from one transactor with the appropriate commander instructions from another transactor. Unfortunately, synchronizing the code threads for every commander instruction would effectively provide a serial operation of the structural model, without introducing much interaction between the functional blocks.

The described arrangement provides inter alia a mechanism for selectively synchronizing individual instruction threads only for specific, selected commander instructions.

For other instructions, the transactors individually process the next instruction in its instruction thread, regardless of what operations the other transactors are performing.

As mentioned previously, in the example of FIG. 4, the instruction stream 55 includes instruction threads for the FBUS transactor 54, the LBUS transactor 52 and the CBUS transactor 56. Each transactor processes instructions from its instruction thread until there is an interdependency between the threads, as described above, at which time the transactor which is waiting for data from another transactor stalls.

For example, an FBUS commander instruction which does a read of memory requires a CBUS responder instruction to provide the memory data. The CBUS instruction thread, however, could be processing CBUS instructions in the instruction stream which occurred prior to the FBUS read, and may be writing the data which the FBUS requires. For the FBUS to obtain the correct memory data, it is important that all of the CBUS instructions are allowed to complete before the FBUS transactor receives the read data.

In order to stall the FBUS transactor, a SYNCH command is provided in instruction stream 55. The SYNCH command includes a bit mask which indicates which transactors must be at the same instruction of instruction stream 55 before proceeding processing of subsequent instructions. In the current example, the SYNCH command indicates to the FBUS transactor that it must hold off any further processing of FBUS commands, until the CBUS instruction thread is in synchronism with the FBUS instruction thread. When they are in synchronism, the CBUS responder instruction is thus providing data in response to the FBUS commander instruction.

It should be noted that in the current example, where the FBUS instruction thread is being synchronized with the CBUS instruction thread, the bit mask of the SYNCH command does not have a bit set to tell the LBUS transactor 52 to stall for any reason. Because the LBUS instruction thread is not effected by the SYNCH command, it continues to process its instruction thread from the instruction stream 55. Thus, logic is exercised within the structural model even when one of the transactors is stalled awaiting synchronization. In addition, the CBUS transactor 56 continues to provide commander and responder instructions to the structural model at all times, until it reaches the SYNCH instruction in the instruction stream 55. When the CBUS transactor 56 processes the SYNCH instruction, it is assured that the CBUS responder instruction associated with the stalled FBUS commander instruction has completed, the FBUS transactor is unstalled, and again all three transactors process instructions from the instruction stream independently.

Figure 5:
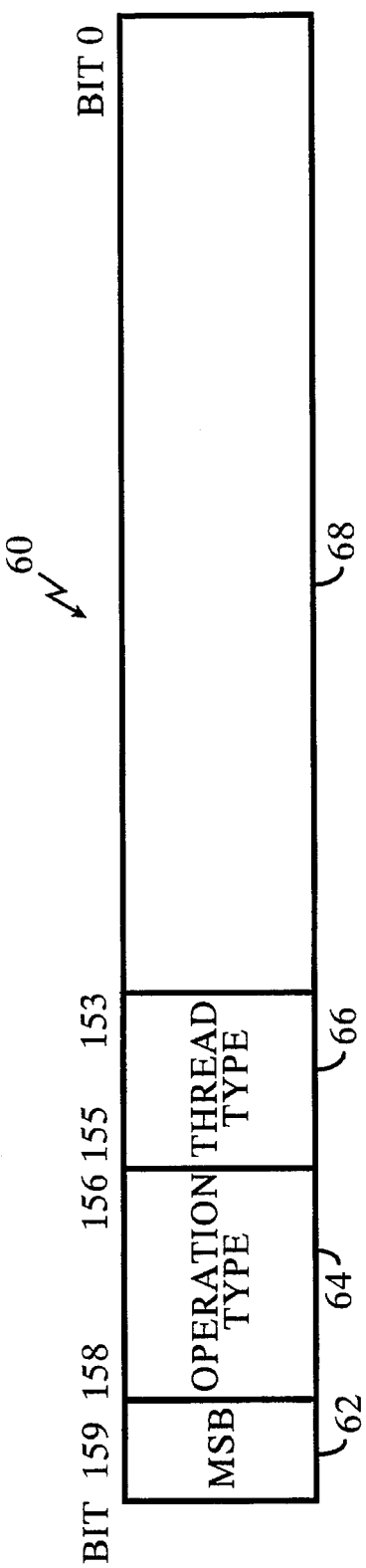
FIG. 5 is a layout of a instruction used in the present invention to program the transactors of FIGS. 4 and 5.

Referring now to FIG. 5, an exemplary instruction entry 60 is shown to include 160 bit elements. The data type field 62, BIT 159 of the entry identifies it as either a data entry or an instruction entry. The thread type field 66, that is bits 123:153 identify the thread type of the entry as ALL, CBUS commander, CBUS responder, LBUS commander, LBUS responder, FBUS commander, FBUS responder. The operation type field 64, bits 158:156, identify the type of operation which each entry performs, include a SYNCH operation, a WAIT operation, a GUARD operation, a SET operation, a TEST operation, and an ACTIVATE operation.

The functionality of the remaining bits in the entry are dependant on the type of operation being performed (as defined by the operation type field 64). Suffice it to say that the instruction for each operation type, for each thread type is defined to accurately simulate the functionality of the unit which it emulates. For example, the remaining bits 68 may include a bit mask field for the SYNCH instruction. However, it should be noted that the SYNCH instruction is used in a unique manner in this invention to expedite testing of the computer system. Details regarding the use of the SYNCH will be discussed later in the specification.

Consequentially, the described arrangement uses both transactors and structural models in the simulation of a computer system 10. Alternatively, a subset of the transactors could be used for testing specific interfaces in a structural model which need to be verified before system simulation can be initiated. Additionally, a combination of multiple structural models and transactors could be used for further design verification.

TABLE II

```
1. [CBC] SET [PRINT_MSG,         2.]
2. [CBC] [D_WRT]   AD[2,100000000] NOI_ID_X[NRM,CPU1,0]
       STL 2 4DC[0,0,0] SD_DO[0,0]ck[0,0] P[0,0]
       XDATA [0,0,000000E00,000000E00]
       XDATA [00000000,00000000,00000000,00000000]
3. [FBC]SET [PRINT_MSG,           3.]
4. [FBC] [read] AD[07D9494A0] M[0] A64[0] SL[1] PRE[0]
       P[0,0] LSTPRE[0] CBE[ ] BSY[0]
       XDATA [000001C8,000001C8,0000001C8,0000001C8]
       XDATA [000001C8,000001C8,0000001C8,0000001C8]
5. [CBR_F] [n_read] AD[0,7D9494A0] NOI_ID_X[NRM,IO,0]
       STL_2_4DC[0.,4.,15.] SD_DO[0,0]ck[0,0]
       XDATA [000001C8,000001C8,0000001C8,0000001C8]
       XDATA [000001C8,000001C8,0000001C8,0000001C8]
6. [LBC]SET [PRINT_MSG,           4.]
7. SYNCH_CBC_CBRL_CBRF_LBC_LBR_FBC_FBR[1,0,0,1,0,0,0]
8. [LBC] [WRITE] DV[TGEC,4] AD[0409D6060] M_CS[0,0] P[0]
       E[0] CBE[0] DS_AS[1,21]
       XDATA [0,0,0,0B02B5B56,0000]
       XDATA[0,0,0,00000]
```

In Table II above, an example of an instruction stream processed by multiple transactors is shown. As mentioned previously, although each transactor processes each instruction in the instruction stream, it only executes the operations which are designated for that transactor. During the processing of each instruction, each transactor decodes the thread type field 66 (FIG. 5) to determine whether or not it is to execute the instruction.

For example, referring again to Table II, a CBUS transactor processes instruction 1. Because the thread type field 66 of the instruction indicates that it is a 'CBC'(CBUS instruction) the CBUS transactor executes instruction 1, then proceeds to instruction 2. The FBUS transactor processes instruction 1 and instruction 2, but does not execute a transaction until it processes instruction 3 because it determines that it is an FBUS transactor instruction. Likewise, the LBUS transactor processes instructions 1 through 5, not actually executing any instruction until it processes instruction 6 and determines that it is an LBUS instruction.

Because simply processing an instruction takes virtually no time, at a given instance in time, the CBUS, FBUS and LBUS transactors are all performing distinct operations. If the different transactors were truly independent, they could simply continue processing their own instruction threads in the instruction stream, thus providing a totally parallel processing environment. The resulting simultaneous operations of each transactor in the parallel processing environment would maximize the logic activity of the structural model and cause any logic design errors to be exposed.

Unfortunately, as described previously, the instruction threads of each transactor cannot always be independent, and there are times that one transactor must wait for another to complete a certain operation before it may begin execution of its own instruction.

Although it is often necessary to have one instruction thread wait for another to complete, it is undesirable to have all transactors waiting for the other transactor threads to complete their tasks before initiating their own, since this provides merely a serially operation environment, with little opportunity for detecting errors due to the interactions of transactions. Therefore it is desirable to have the minimum number of threads waiting so that as the greatest amount of logic activity is occurring at a given instance in the structural model under test.

As discussed previously, the SYNCH instruction allows selective synchronization between the code thread of the transactors. Where interdependencies between transactor instructions occur, the SYNCH instruction is inserted in the instruction stream, with the appropriate bit mask set to force one transactor to forego processing its instruction until another transactor has completed processing its code thread. Thus the SYNCH instruction provides a mechanism for allowing multiple transactors to achieve the highest level of parallel processing and logic activity within the structural model despite instruction dependencies.

An example of a the use of a SYNCH instruction to maintain order in the execution of a instruction stream is shown in Table II. As mentioned previously, the SYNCH command (instruction 7) includes a mask (shown bolded) which indicates which transactors must have completed all their prior operations before the next instruction may begin processing. Depending on the type of instruction that the transactor is executing, a transactor may be finished processing its operation when it completes its commander instruction. However, if the type of instruction includes an associated responder instruction, the instruction is not completed until the corresponding responder instruction has been executed. Therefore in this example, the CBUS commander and the LBUS commander finish their previous transactions before the next LBUS instruction (instruction 6) is processed.

Figure 6:
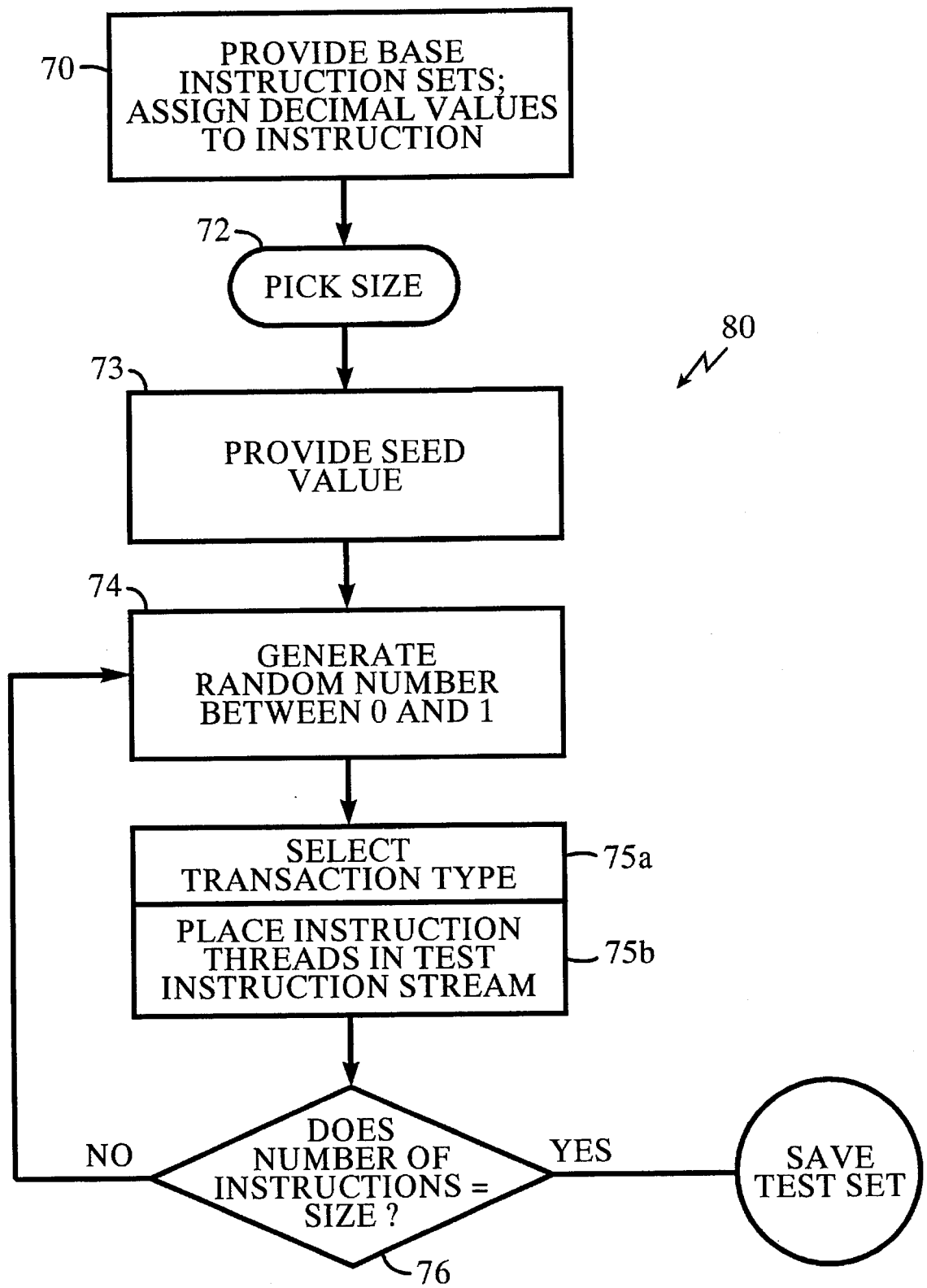
FIG. 6 is a flow diagram illustrating a method of the present invention of providing the instruction stream of FIG. 4.

Referring now to FIG. 6, test process 50 of FIG. 4 includes a process for providing a test set, preferably a random test instruction set, for use by transactors to test a structural model includes the following steps. At step 70 a set of base instructions for each transactor is provided. This set of base instructions can include all types of commands which the functional unit that the transactor is emulating is capable of providing. The base instruction may include a commander instructions and associated responder instructions, a SYNCH instruction or a SET or TEST instruction, and hence it should be understood that the base instruction may provide more than one instruction to the instruction thread. The base set for each transactor is combined, and each instruction in the combined set is assigned a decimal value between 0 and 1. The assignment of the decimal value is determined such that an even distribution of instructions is provided between the range of 0 and 1.

At step 72, a size for the test run is selected, indicating the number of base instructions which will be used in the simulation. At step 73, a seed integer is provided. This seed integer is used at step 74 by a random number generator to select a pseudo random number between 0 and 1. At step 75a, this pseudo random number is used to select one of the instructions from the combined set of instructions, where the instruction having the decimal value closest to the pseudo random number is selected, and at step 75b the instructions associated with that instruction are placed test in the instruction set. Steps 73 through 75b are repeated, with an instruction being selected and its associated instructions being sequentially placed in the test instruction set until the maximum number of instructions for the test run have been provided.

The above described process for providing a pseudo random instruction set allows selective synchronism of transactor instruction threads to allow virtual parallel processing of random combinations of transactions, thus providing logic activity in the computer system which cannot be easily anticipated by designers of the circuits. By uncovering potential design problems, schematic updates and perhaps microcode restrictions can be identified before the expensive manufacturing process has been initiated.

Figure 7:
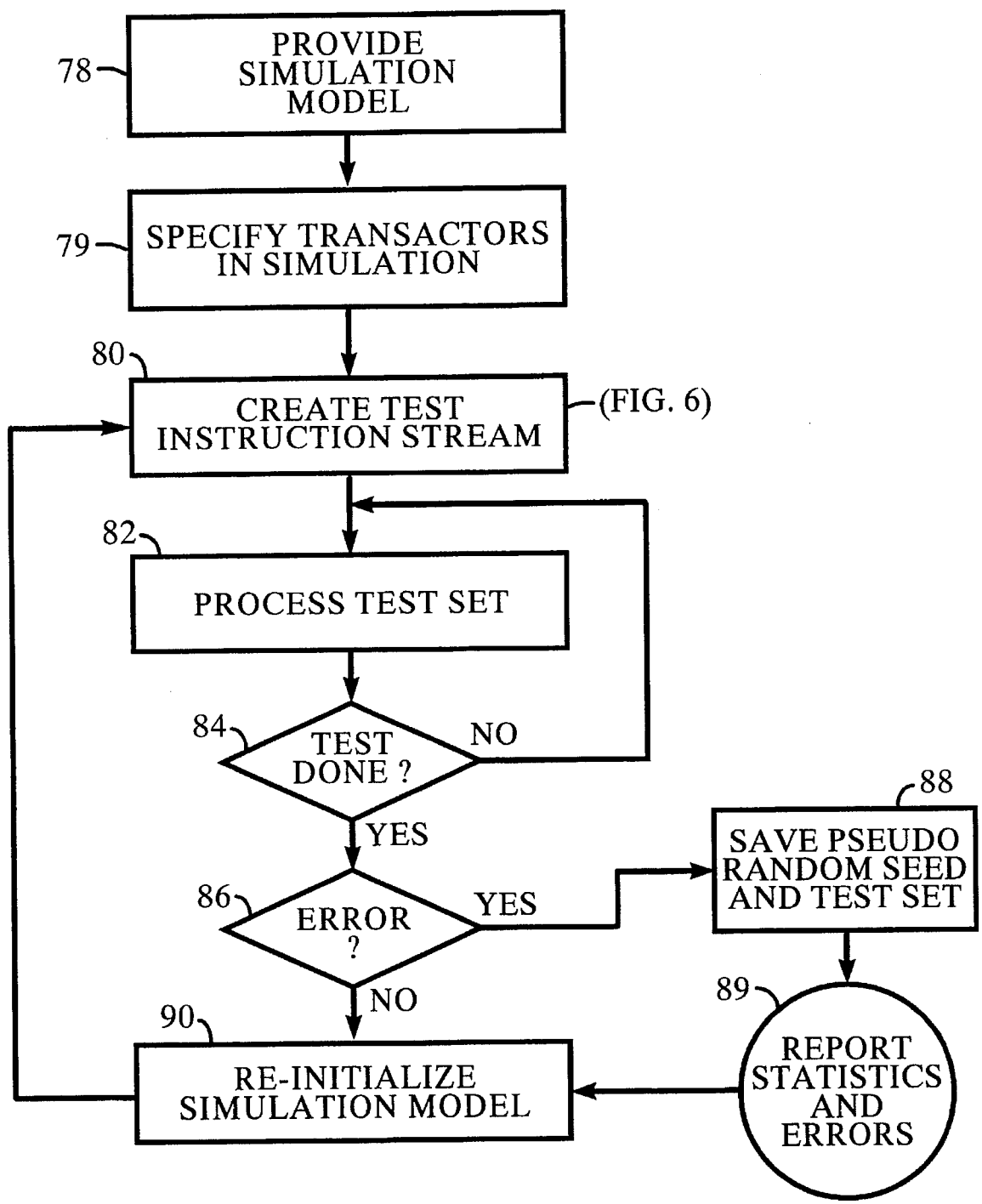
FIG. 7 is a flow diagram illustrating a method of the present invention of using the instruction stream provided in the method of FIG. 6 to verify the computer system of FIG. 1.

Referring now to FIG. 7, a method for using the test instruction set to uncover potential design flaws is shown. Because the test sets are generated at random, multiple test sets are likely to uncover very different design flaws. With this purpose in mind, an iterative testing method is provided.

At step 78, a system simulation model is provided. The system simulation model may include a combination of units which are structural models, and units which are emulated by transactor models. The system simulation which is provided is initialized, that is all the registers, memory, and status bits are in a known, predetermined state. At step 79, the transactors which are included in the system are indicated to the test processor 50 (FIG. 4), and at step 80, a test set is provided as discussed with reference to FIG. 6.

At step 82, the test set is processed by the system simulation model. Processing continues until at step 84 it is determined that the processing of the test set has completed. At step 86 it is determined whether an error has occurred during the simulation. This can be determined in one of two ways. First, the transactors are able to indicate if a structural model has returned data which differed from that expected by the commander string. Second, various states in the structural model can be examined (such as cache memory contents, register values, etc.) to determine if all states in the structural model are correct. If it is determined that there is no error, at step 90 the system simulation model is re-initialized, and the process returns to step 80, where a new pseudo random test instruction set is provided for processing.

If it is determined that an error did occur during the processing of the test instruction set, at step 88 the pseudo random seed number which was used to generate the test set is saved along with the test set itself in a file, and at step. 89 the user is notified of the occurrence of an error. The process then proceeds to step 90, the system simulation model is re-initialized, and the process returns to step 80, where a new pseudo random test instruction set is provided. The process of providing pseudo random test sets, processing the test sets using the transactors and the structural models, and providing error information when an error occurs continues until the program is manually stopped by the user. Each failed test set provided by the test process may be used by the designers to re-create, isolate and correct the error in the structural model.

Accordingly, an iterative testing method provides a mechanism which facilitates the isolation of errors in a system simulation model. A method for providing a random test instruction set provides combinations of instructions which are not readily apparent using standard manual simulation tactics. In addition, a method for synchronizing transactor threads only in the event of certain dependencies between transactor threads provides for the maximum amount of logical activity within the system simulation model, thus facilitating the detection of errors in a structural model.

Having described a preferred embodiment of the invention, it will now become apparent to one of skill in the art that other embodiments incorporating its concepts may be used. It is felt, therefore, that this embodiment should not be limited to the disclosed embodiment, but rather should be limited only by the spirit and scope of the appended claims.

What we claim is:

1. A method of providing a test set for testing computer model comprising the steps of:

providing a logical model of an integrated circuit, having a plurality of data ports;

providing at least two simulators, a first simulator coupled to a first one of said plurality of data ports of said integrated circuit model, and second simulator coupled to a second different one of said plurality of data ports of said integrated circuit model;

providing an instruction stream to said first and second simulators, said instruction stream comprising at least two instruction threads corresponding to said at least two simulators, said simulators providing signals to said data ports in accordance with instructions provided from each of said instruction threads, wherein each of said instruction threads includes command instructions for providing command data to said corresponding data port; and delaying said first simulator from processing its corresponding instruction thread when a dependency is present between said at least two instruction threads until said dependency has been satisfied.

2. The method of claim 1, wherein each of said instruction threads includes responder instructions for providing data to one of said plurality of ports of said structural model in response to signals from said port.

3. The method of claim 1, wherein said step of delaying is responsive to a synchronizing instruction in said instruction stream which precludes said first simulator from processing said corresponding instruction thread until a selected instruction in said second instruction thread is processed by said second simulator.

4. The method of claim 3, wherein said synchronizing instruction includes a bit mask having at least two bits wherein each bit of said bit mask corresponds to one of said at least two simulators.

5. The method of claim 4, wherein at least one of said simulators is precluded from processing a commander instruction from said corresponding instruction thread responsive to a set condition of said corresponding bit of said bit mask and a set condition of at least one other bit in said bit mask.

6. The method of claim 4, wherein said simulator precluded from processing said corresponding instruction thread is allowed to process said corresponding instruction thread when said simulator corresponding to said one other set bit in said bit mask completes processing of said synchronization instruction.

7. A method of providing a test set for testing a computer model having a plurality of simulators, said method comprising the steps of:

selecting a base instruction set, said base instruction set including a plurality of instructions for each of said plurality of simulators;

randomly selecting an instruction from said base instruction set to provide said test set;

identifying instructions of said test set which require predetermined conditions to be completed before execution; and modifying said identified instruction to preclude execution of said identified instruction until said predetermined condition is satisfied.

8. The method of claim 7, wherein said step of modifying said identified instruction further comprises the steps of:

inserting a synchronization instruction before said identified instruction, said synchronization instruction having a bit mask with each bit of said bit mask corresponding to one of said plurality of simulators, and with each set bit of said bit mask indicating that said corresponding simulator should be synchronized to said identified instruction before said identified instruction is executed.

* * * * *